United States Patent [19]
Fukuda

[11] Patent Number: 6,079,408
[45] Date of Patent: Jun. 27, 2000

[54] SUN-RAY TRACKING SYSTEM

[75] Inventor: Taro Fukuda, Wako, Japan

[73] Assignee: Honda Giken Kogyo Kabushiki Kaisha, Tokyo, Japan

[21] Appl. No.: 09/276,661

[22] Filed: Mar. 26, 1999

[30] Foreign Application Priority Data

Mar. 30, 1998 [JP] Japan .................................. 10-083125
Feb. 23, 1999 [JP] Japan .................................. 11-044251

[51] Int. Cl.$^7$ .................................. F24J 2/38; F24J 2/00
[52] U.S. Cl. .......................... 126/578; 126/600; 126/606; 126/700; 126/906
[58] Field of Search .................................. 126/578, 577, 126/600, 605, 606, 607, 698, 699, 700, 576, 573, 906

[56] References Cited

U.S. PATENT DOCUMENTS

| 514,669 | 2/1894 | Allingham | 126/605 |
|---|---|---|---|
| 4,088,121 | 5/1978 | Lapeyre | 126/605 |
| 4,187,123 | 2/1980 | Diggs | 126/601 |
| 4,365,617 | 12/1982 | Bugash et al. | 126/578 |
| 4,425,904 | 1/1984 | Butler | 126/606 |
| 4,995,377 | 2/1991 | Eiden | 126/605 |

FOREIGN PATENT DOCUMENTS 57-10337  2/1982  Japan .

*Primary Examiner*—Ira S. Lazarus
*Assistant Examiner*—Josiah C. Cocks
*Attorney, Agent, or Firm*—Arent Fox Kinter Plotkin & Kahn, PLLC

[57] ABSTRACT

A plurality of sun-ray collecting units connected to one another by parallel links and arranged in rows on first turning axes are supported on a pair of turning frames that can be turned about the first turning axes. Each of a pair of push-pull cables 54 is connected at one end thereof to a cable driving device and at the other end to one of the sun-ray collecting units which are supported in plurality on each of the turning frames. Thus, a space for placement of a sun-ray tracking system can be relatively reduced in size and the turning angle of each of the sun-ray collecting units about the first turning axis can be relatively increased. The sun-ray collecting units can be turned about the second turning axes in a simple structure using a single drive source.

7 Claims, 8 Drawing Sheets

SUN-RAY TRACKING SYSTEM

BACKGROUND OF THE INVENTION

1. Field of the Invention

The present invention relates to a sun-ray tracking system in which tow rows of sun-ray collecting units are arranged along first turning axes, respectively, with each row having a plurality of the units, and the rows of collecting units can be turned about the first turning axes and also about second turning axes perpendicular to the first turning axes.

2. Description of the Related Art

Such a sun-ray tracking system is already known, for example, from Japanese Patent Publication No. 57-10337.

In the above known sun-ray tracking system, the sun-ray collecting units turnable about the second turning axes are mounted at a plurality of places spaced apart from one another in an axial direction of a main shaft with its center matched with the first turning axis, in such a manner that the units are aligned on opposite sides of the main shaft. A motor is connected to one end of a driving shaft extending in parallel to the first turning axis, and sector-shaped worm wheels connected respectively to the sun-ray collecting units are meshed with a plurality of worms provided on the driving shaft. For this reason, each of the sun-ray collecting units is turned to describe a turning locus at a location spaced apart from the center of the main shaft by turning movement of the main shaft about its axis, i.e., the first turning axis, resulting in an increased limitation for a placing area. Especially, when the main shaft is turned to turn the sun-ray collecting units in an east-west direction, the turning angle is relatively increased. Therefore, an unoccupied space required for turning movement of each of the sun-ray collecting units is increased in size, and it is difficult to place the sun-ray tracking system, for example, on a roof of a house or building.

For the purpose of solving such a problem, it is conceived that a plurality of sun-ray collecting units are supported, for turning movement about each of second turning axes, on each of a pair of turning frames which are turnable about a pair of first turning axes established in parallel to each other. However, if a driving mechanism including a worm and a worm wheel as in the prior art is used in order to turn the sun-ray collecting units about the second turning axes, a drive source such as a motor or the like is required for each turning frame, whereby an increase in cost is brought about, and it is necessary to accurately control both the drive sources, so that no operational difference is produced between both the turning frames.

SUMMARY OF THE INVENTION

Accordingly, it is an object of the present invention to provide a sun-ray tracking system, wherein a space for placement of the sun-ray tracking system can be relatively reduced in size and moreover, the turning angle of each of the sun-ray collecting units about the first turning axis can be relatively increased, and the sun-ray collecting units can be turned about the second turning axes in a simple structure using a single drive source.

To achieve the above object, according to a first feature of the present invention, there is provided a sun-ray tracking system including two rows of sun-ray collecting units which are arranged along first turning axes, respectively, with each row having a plurality of the collecting units and the rows of the collecting units can be turned about the first turning axes and also about second axes perpendicular to the first turning axes, wherein the system further includes a pair of turning frames which are supported between first and second stationary support plates for turning movement about a pair of the first turning axes established in parallel to each other, wherein the plurality of sun-ray collecting units, which are connected together by each of parallel links disposed in a plane parallel to each of the first turning axes and which are arranged on each of the first turning axes, are supported on each of the turning frames for turning movement about the second turning axes respectively which are provided corresponding to the sun-ray collecting units, a single cable driving means being mounted on the first support plate, and a pair of push-pull cables, each having one end connected to the cable driving means and the other end connected to one of the plurality of the sun-ray collecting units supported on each of the turning frames.

With the arrangement of the first feature, the plurality of sun-ray collecting units arranged on each of the first turning axes are supported for turning movement about the second turning axes on each of the pair of turning frames which are turnable about the pair of first turning axes parallel to each other. Therefore, the sun-ray collecting units are turned about their portions located on the first turning axis, when each of the turning frames is turned about the first turning axis. Thus, a space required by the turning movement of the sun-ray collecting units about the first turning axis may be relatively small and moreover, the sun-ray collecting units can be turned on a large scale about the first turning axis. The sun-ray collecting units are connected together by each of the parallel links disposed in the plane parallel to the first turning axis, and each of the pair of push-pull cables connected at one ends thereof to the single cable driving means is connected at the other end thereof to one of the plurality of sun-ray collecting units which are supported on each of the turning frames. Therefore, the sun-ray collecting units can be turned about the second axes in a simple structure using the single driving source.

According to a second aspect and feature of the present invention, in addition to the arrangement of the first feature, the turning frames are supported on the first and second stationary support plates through first and second main shafts which are coaxially disposed on the first turning axis, the plurality of the sun-ray collecting units for converting sun rays into an electric energy are connected together in series through lead wires disposed along the first turning axis, and lead wires extending from opposite end ones of the sun-ray collecting units in a direction of arrangement of the plurality of the sun-ray collecting units are passed through the first and second main shafts and drawn to positions outside of the first and second support plates.

With the arrangement of the second feature, the lead wires connecting the sun-ray collecting units to one another in series are disposed along the first turning axis, and the lead wires extending from the sun-ray collecting units located at the opposite ends in the direction of arrangement of the plurality of sun-ray collecting units are drawn to the outside of the first and second support plates through the first and second main shafts whose positions are not changed despite turning movement of the sun-ray collecting units about the first and second turning axes. Therefore, the surplus loosening of the lead wires can be reduced to the utmost and hence, a space for the loosened surplus of the lead wires can be reduced, end the appearance of the lead wires disposed can be improved.

According to a third aspect and feature of the present invention, in addition to the arrangement of the first or second feature, a pair of turning-frame driving means are provided on the first support plate for driving the turning frames for turning movement about the first turning axes respectively, and the cable driving means is mounted on the first support plate between both the turning-frame driving means.

With the arrangement of the third feature, the pair of turning-frame driving means for driving the turning frames in turning movement about the first turning axes respectively and the single cable driving means for driving the sun-ray collecting units in turning movement about the second turning axes can be disposed in a compact arrangement on first one of the first and second support plates commonly supporting both the turning frames.

According to a fourth aspect and feature of the present invention, in addition to the arrangement of the second feature, at least the first main shaft of the first and second main shafts is secured to each of the turning frames, turning-frame driving means are provided in individual correspondence to the turning frames on the first support plate that supports both the first main shafts commonly and turnably, each of the turning-frame driving means being formed to have a driving shaft as one component thereof having a rotational axis perpendicular to an axis of the first main shaft, and is connected to the first main shaft, and a drive source is connected to the driving shaft in one of the turning-frame driving means, the driving shaft of the one turning-frame driving means and the driving shaft of the other turning-frame driving means is connected to each other through universal joints means.

With the arrangement of the fourth feature, the pair of turning frames can be turned in operative association with each other about the first turning axes by inputting power from the single drive source to the one turning-frame driving means. Moreover, an error in assembling of the turning frames to the first support plate and a variation in size between the turning-frame driving means can be absorbed to ensure that the power can be reliably transmitted between both the turning-frame driving means.

According to a fifth aspect and feature of the present invention, in addition to the arrangement of the first or second feature, the sun-ray collecting units are supported at their upper portions on each of the turning frames for turning movement about the second turning axes. With the arrangement of the fifth feature, the sun-ray collecting units are supported on each of the turning frames at locations closer to their upper surface, i.e., light-receiving surfaces. Thus, the positions of the light receiving surfaces can be stabilized.

According to a sixth aspect and feature of the present invention, in addition to the arrangement of the first feature, the other ends of the push-pull cables are connected to the sun-ray collecting units above vertical central portions of the sun-ray collecting units. With the arrangement of the sixth feature, the sun-ray collecting units can be turned on a relatively scale about the second turning axes by use of the push-pull cables exhibiting a relatively small stroke.

According to a seventh aspect and feature of the present invention, in addition to the arrangement of the second feature, the lead wires are connected to bottoms of the sun-ray collecting units. With the arrangement of the seventh feature, it is easy to connect the sun-ray collecting units to one another in series.

The above and other objects, features and advantages of the invention will become apparent from the following description of the preferred embodiment taken in conjunction with the accompanying drawings.

BRIEF DESCRIPTION OF THE DRAWINGS

FIGS. 1 to 8 show an embodiment of the present invention, wherein

FIG. 1 is a plan view of a solar generator system;

FIG. 2 is a sectional view taken along a line 2—2 in FIG. 1;

FIG. 3 is a vertical sectional view of a sun-ray collecting unit;

FIG. 4 is a sectional view taken along a line 4—4 in FIG. 1;

FIG. 5 is a sectional view taken along a line 5—5 in FIG. 4;

FIG. 6 is an enlarged sectional view taken along a line 6—6 in FIG. 1;

FIG. 7 is an enlarged sectional view taken along a line 7—7 in FIG. 5; and

FIG. 8 is an enlarged sectional view taken along a line 8—8 in FIG. 1.

DETAILED DESCRIPTION OF THE PREFERRED EMBODIMENTS

Figure 1:
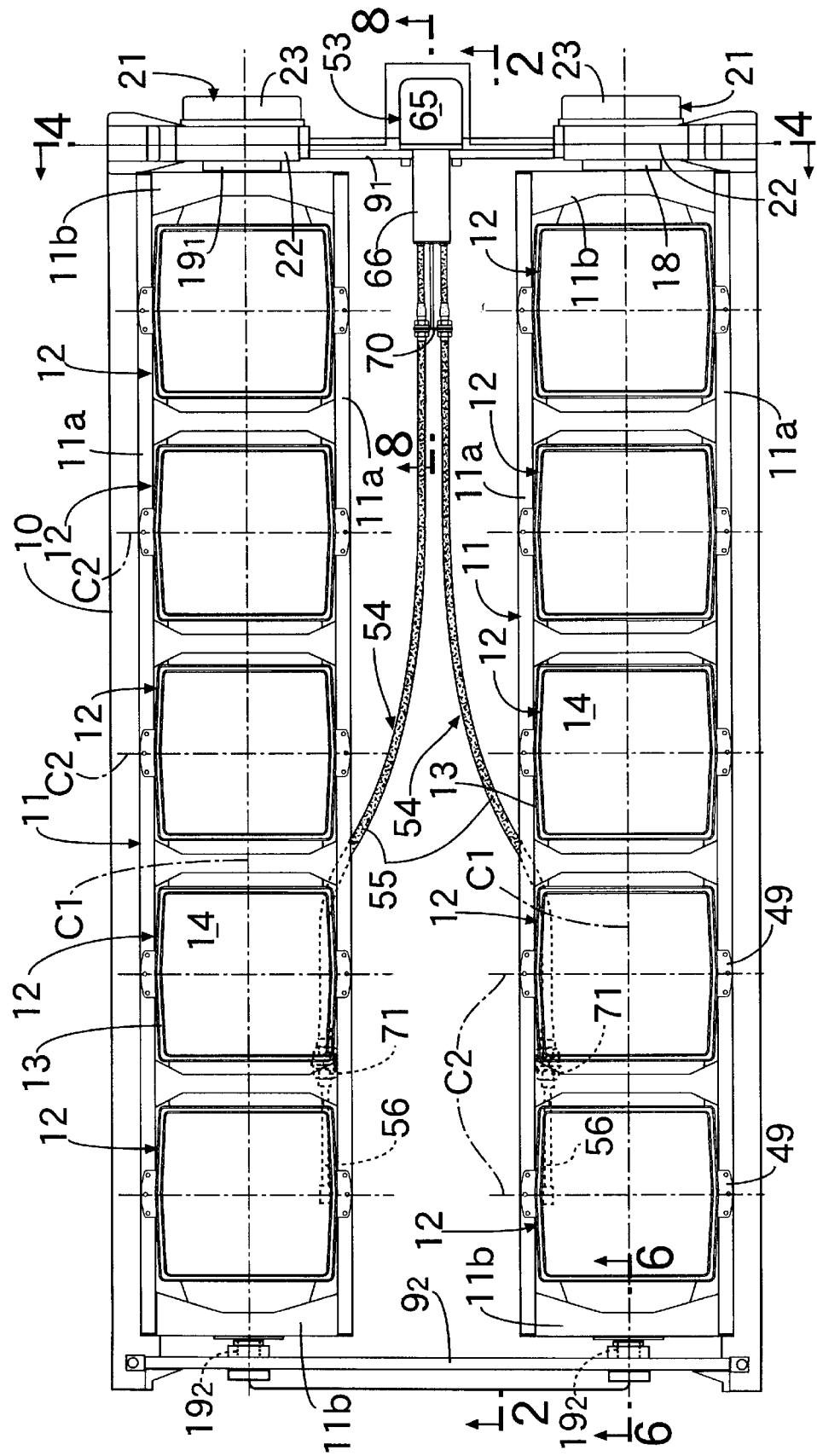
Figure 2:
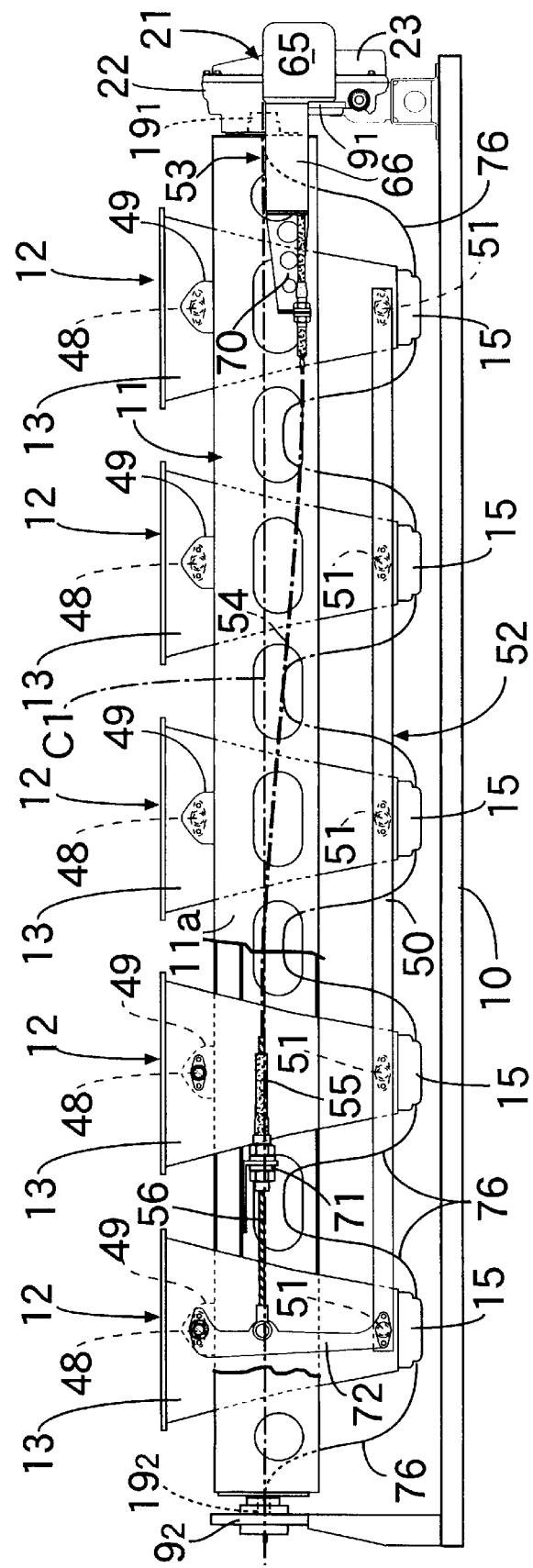

The present invention will now be described by way of an embodiment with reference to FIGS. 1 to 8. Referring first to FIGS. 1 and 2, a pair of first and second support plates 91 and 92 are disposed at locations spaced apart from each other in a north-south direction and fixed onto a support frame 10 which is fixed onto a ground surface or a roof of a house or building. A plurality of, e.g., a pair of turning axes C1, C1 are established in the north-south direction at locations spaced apart from each other between the support plates $9_1$ and $9_2$. A plurality of, e.g., a pair of turning frames 11, 11 are supported between the support plates $9_1$ and $9_2$ for turning movement about the first turning axes C1, C1. Two sets of five sun-ray collecting units 12, 12 arranged plurality by plurality, e.g., five by five on the first turning axes C1, C1 are supported on the turning frames 11, 11 respectively for turning movement about a plurality of second turning axes C2 each established for every sun-ray collecting unit 12 and extending in a direction perpendicular to the first turning axes C1, C1. Specifically, when the first turning axis C1 extends in the north-south direction, the sun-ray collecting units 12 are supported on each of the turning frames 11 for turning movement about the second turning axes C2 extending in an east-west direction.

Figure 3:
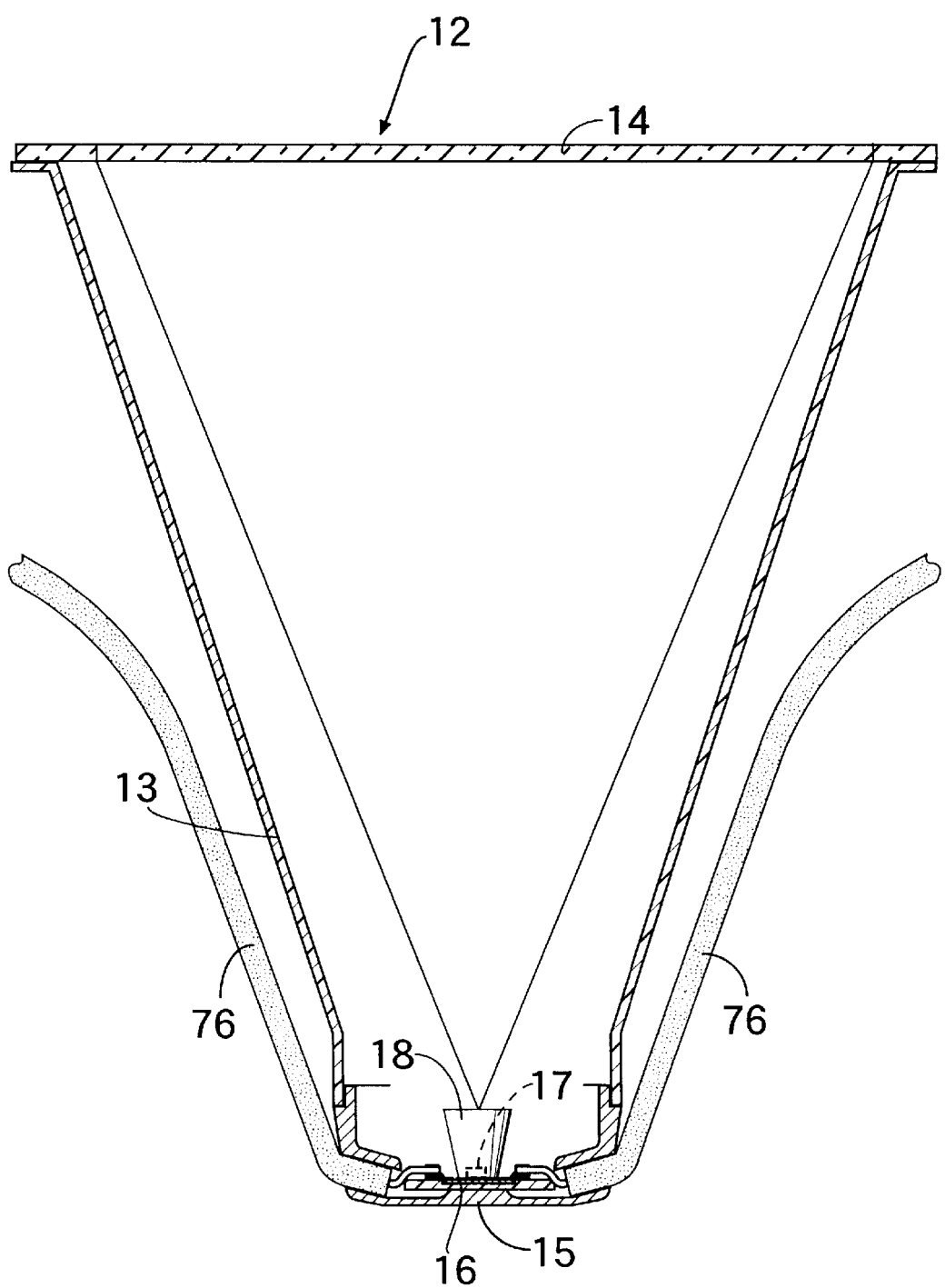

Referring to FIG. 3, each of the sun-ray collecting units 12 includes a tetragonal pyramid-shaped housing 13 with its width increased upwards, a lens 14 fixed to an upper end of the housing 13 to close the upper end of the housing 13, a support plate 15 closing a lower end of the housing 14, a base plate 16 fixed to an inner surface of the support plate 15, a solar battery cell 17 bonded to a surface of the base plate 16, and a light guide 18 affixed to a surface of the solar battery cell 17, so that rays collected by the lens 14 are converted into an electric energy. The sun-ray collecting units 12 are driven to track the sun, so that their upper surfaces, i.e., light-receiving surfaces are always turned to the sun.

Each of the turning frame 11 is formed into a rectangular frame shape by a pair of side plates 11a, 11a extending on the first turning axis C1, and a pair of end plates 11b, 11b connecting opposite ends of the side plates 11a, 11a, respectively. First and second main shafts $19_1$, and $19_2$ with their axes matched with the first turning axis C1 are secured to the end plates 11b, 11b, respectively. The first main shaft $19_1$, is turnably supported on one $9_1$ of the support plates $9_1$ and $9_2$, and the second main shaft $19_2$ is turnably supported on the other support plate $9_2$.

Figure 4:
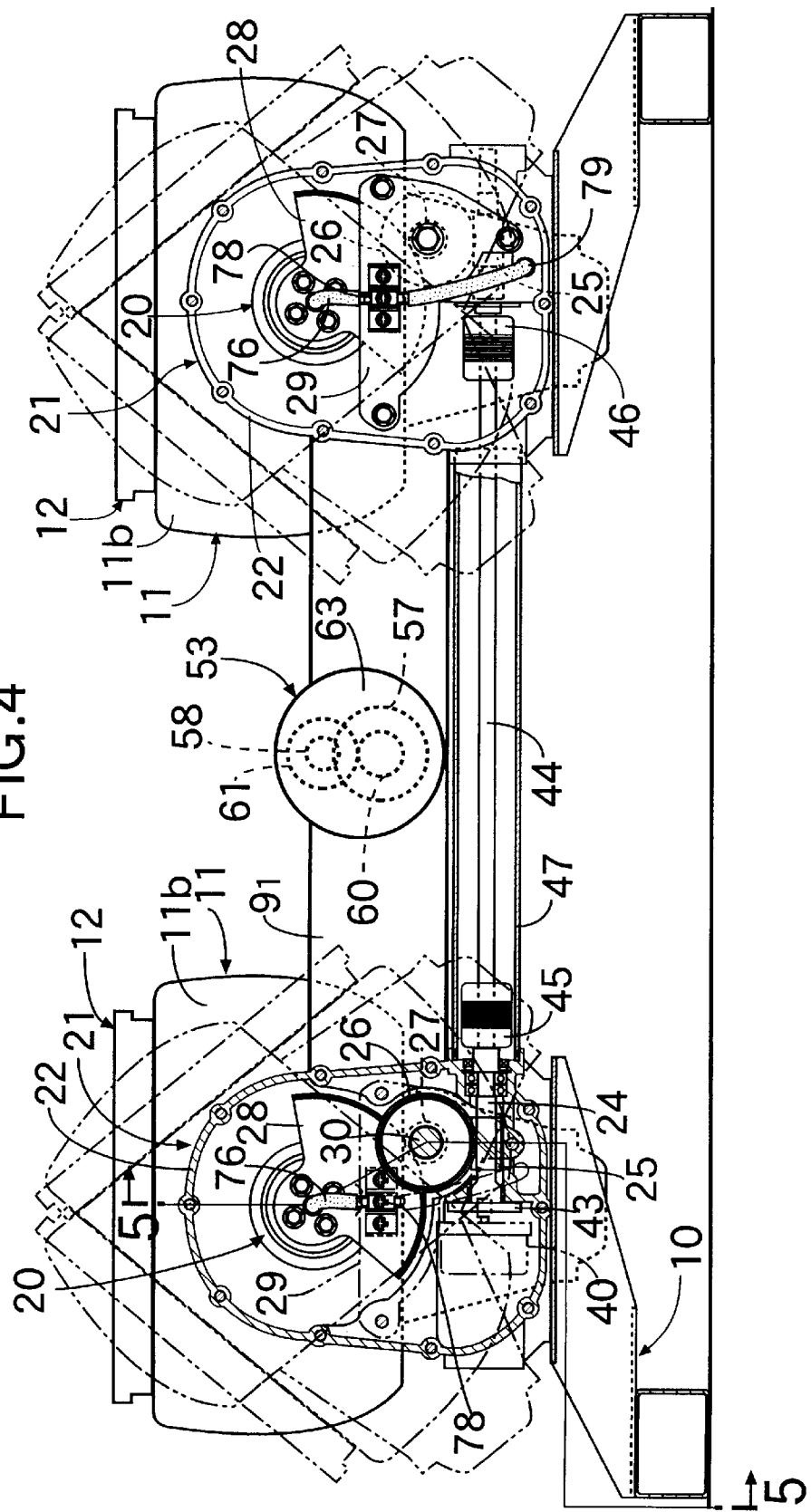
Figure 5:
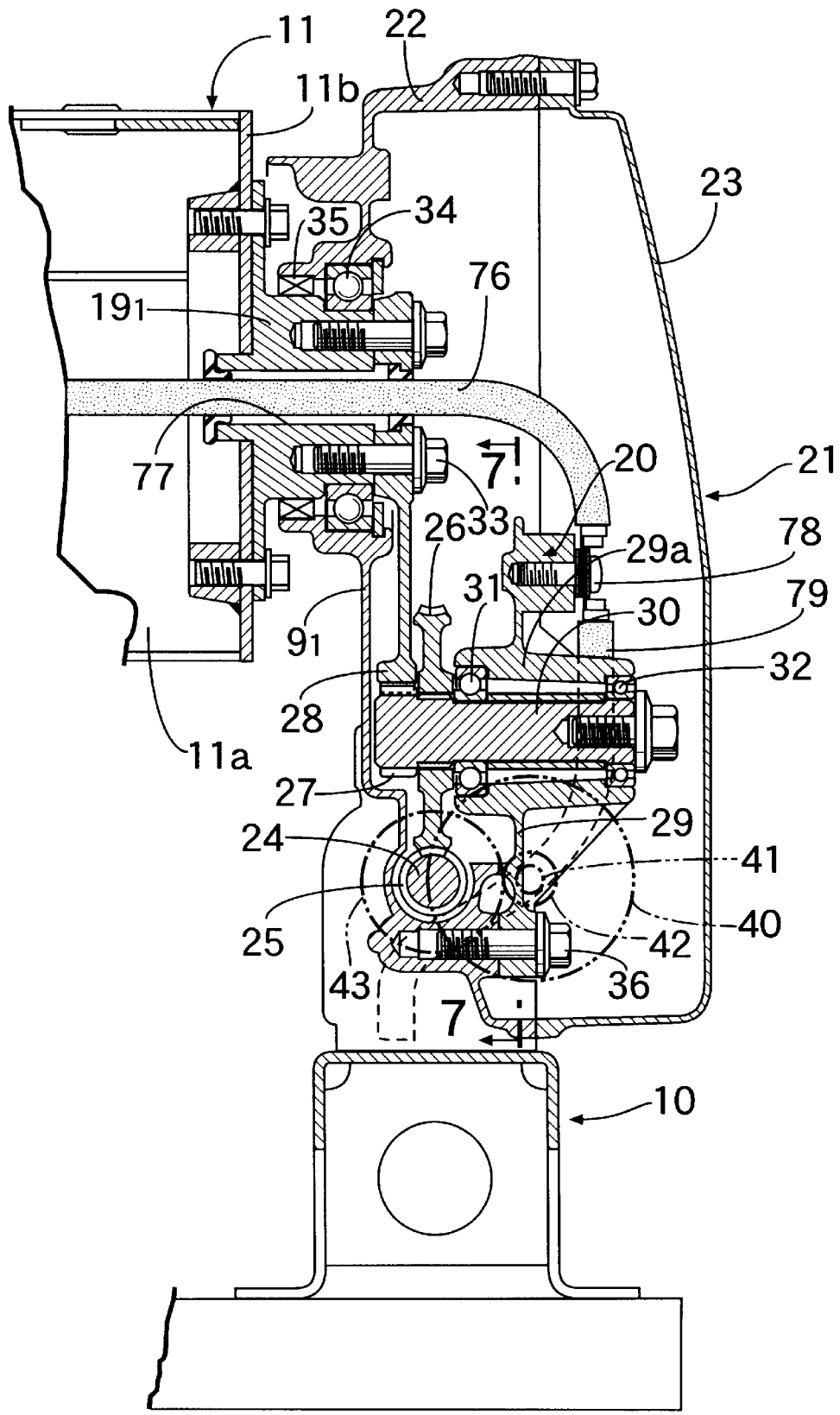

Referring also to FIGS. 4 and 5, turning-frame driving means 20, 20 individually corresponding to the turning frames 11, 11 are provided at opposite ends of the first support plate $9_1$ and accommodated within a pair of gear cases 21, 21, respectively.

The gear cases 21 are formed into the same shape and each have a case portion 22 formed integrally at each of the opposite ends of the first support plate $9_1$, and a cover 23 fastened to the case portion 22. The first main shaft $19_1$, secured to the turning frame 11 is rushed into the gear case 21.

The turning-frame driving means 20 includes a driving shaft 24 extending in a direction perpendicular to the first turning axes C1, C1, a worm 25 provided on the driving shaft 24, a worm wheel 26 meshed with the worm 25, an intermediate gear 27 rotatable in unison with the worm wheel 26, and a driven gear 28 fixed to the first main shaft $19_1$, so that a power can be transmitted from the driving shaft 24 to the first main shaft $19_1$.

The driving shaft 24 is turnably supported at its opposite ends by the case portion 22, and the worm 25 is provided at an intermediate portion of the driving shaft 24. The worm wheel 26 is spline-coupled to a rotary shaft 30 which has an axis parallel to the first turning axes C1, C1 and which is rotatably supported on a support member 29 fastened to the case portion 22 within the gear case 21. An intermediate gear 27 is integrally provided on the rotary shaft 30 at a location close to the worm wheel 26 along the axis of the rotary shaft 30. More specifically, the support member 29 is integrally provided with a cylindrical support tube portion 29a, and a pair of bearings 31 and 32 are mounted between the support tube portion 29a and the rotary shaft 30 inserted into the support tube portion 29a to inhibit the axial movement of the rotary shaft 30. The worm wheel 26 is spline-coupled to the rotary shaft 30 in such a manner that it is sandwiched between an inner ring of one of the bearings 31 and the intermediate gear 27.

Figure 6:
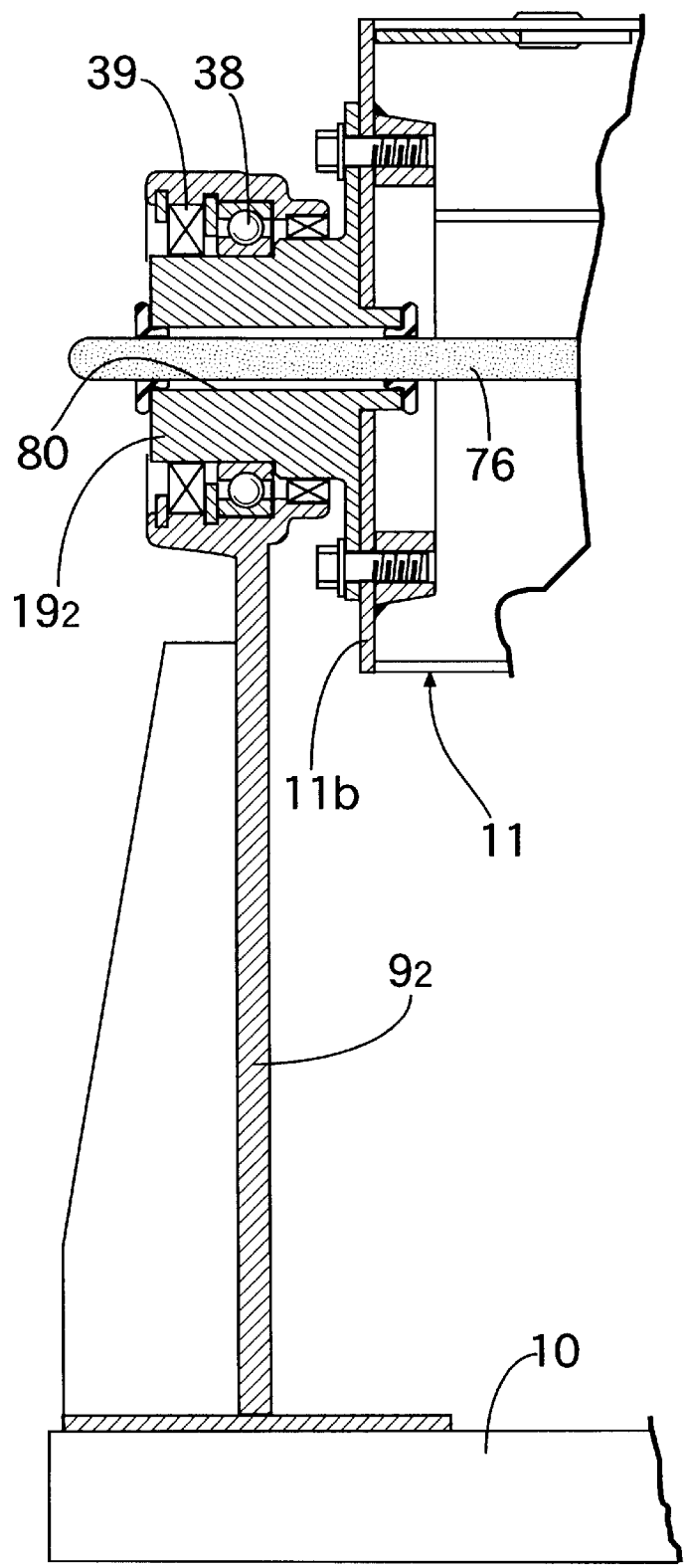

Further, the driven gear 28 is formed into a sector shape and fastened to the first main shaft $19_1$ by a plurality of bolts 33. A bearing 34 is interposed between the first main shaft $19_1$ and the case portion 22, and an annular seal member 35 is also interposed between the first main shaft $19_1$ and the case portion 22 to lie outside the bearing 34. On the other hand, a bearing 38 is interposed between the second main shaft $19_2$ secured to the turning frame 11 coaxially with the first main shaft $19_1$ and the second support shaft $9_2$, to lie outside the bearing 38 and an annular seal member 39 is also interposed between the second main shaft $19_2$ and the second support shaft $9_2$, as shown in FIG. 6.

Figure 7:
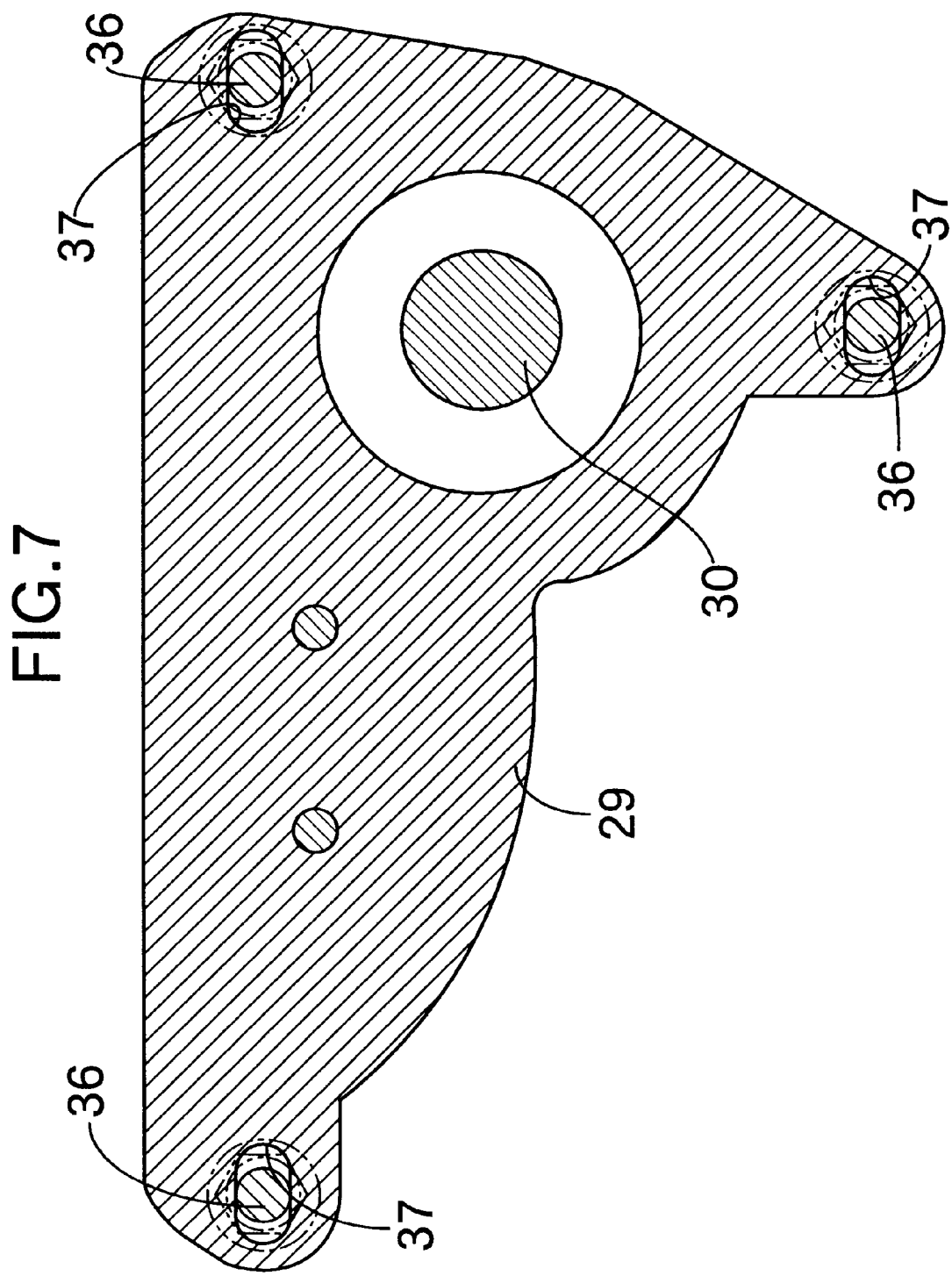

Referring to FIG. 7, the support member 29 is fastened to the case portion 22 by a plurality of, e.g., three fastening bolts 36, and insertion bores 37 are defined in the support member 29 as elongated bores longer in the axial direction of the driving shaft 24, so that the fastening bolts 36 are inserted through the insertion bores 37 to threadedly fasten the support member 29 to the case portion 22. Therefore, the support member 29 can be attached to the case portion 22, i.e., to the first support plate 9, so that the position thereof can be regulated in a direction parallel to the axis of the driving shaft 24.

A turning-frame driving motor 40 as a drive source has a turning axis parallel to the axis of the driving shaft 24, and is accommodated and fixed in one of the gear cases 21, in which one of the turning-frame driving means 20 which is disposed on the left as viewed in FIG. 4 is accommodated. An output gear 42 is provided on an output shaft 41 of the turning-frame driving motor 40 and meshed with a gear 43 provided at one end of the driving shaft 24. Thus, a driving force output from the turning-frame driving motor 40 is reduced by the output gear 42 and the gear 43 and transmitted to the driving shaft 24, and further reduced by the above-described one turning-frame driving means 20 and transmitted to one of the turning frames 11.

The driving shaft 24 of the one turning-frame driving means 20 and the driving shaft 24 of the other turning-frame driving means 20 are connected to opposite ends of a transmitting shaft 44 extending in an axial direction of the driving shafts 24 through universal joints 45 and 46, respectively, so that a turning drive force provided by the single turning-frame driving motor 40 is transmitted from both of the turning-frame driving means 20, 20 to both of the first main shafts 9, 9, thereby turning the turning frames 15, 15 about the first turning axes C1, C1.

Moreover, the transmitting shaft 44 is disposed below the first support plate $9_1$, and a protecting case 47, in which the transmitting shaft 44 and the universal joint 45 connecting the transmitting shaft 44 to the driving shaft 24 of the one turning-frame driving means 20 are accommodated, is provided to extent between both the gear cases 21, 21.

The sun-ray collecting units 12 are supported at their upper portions on the turning frames 11, 11 for turning movement about the second turning axes C2. More specifically, a pair of subsidiary shafts 48, 48 having axes matched with the second turning axes C2 are secured to the opposite sides of each of the upper portions of the sun-ray collecting units 12 to protrude sideways. The subsidiary shafts 48 are turnably supported respectively by five bearings 49 which are fixedly disposed at distances on each of both the side plates 11a, 11a in each of the turning frame 11.

Moreover, lower portions of the two sets of five sun-ray collecting units 12 are connected through connecting shafts 51 to a connecting rod 50 extending in a direction of arrangement of the sun-ray collecting units 12 for turning movement about axes parallel to the second turning axes C2. The side plates 11a, 11a of the turning frame 11, the sun-ray collecting units 12 and the connecting frame 50 constitute a parallel link 52 in a plane parallel to the first turning axis C1. The sun-ray collecting units 12 on each of the turning frames 11 are connected together through the parallel link 52 disposed in the plane parallel to the first turning axis C1, so that they are turned in operative association with one another about the second turning axes C2 individually corresponding to the sun-ray collecting units 12.

The first support plate $9_1$ between the turning-frame driving means 20, 20 is provided with a single cables driving means 53. A pair of push-pull cables 54, 54 connected at their one ends to the cable driving means 53 are each connected at the other end thereof to one of the plurality of sun-ray collecting units 12 supported on each of the turning frames 11.

Figure 8:
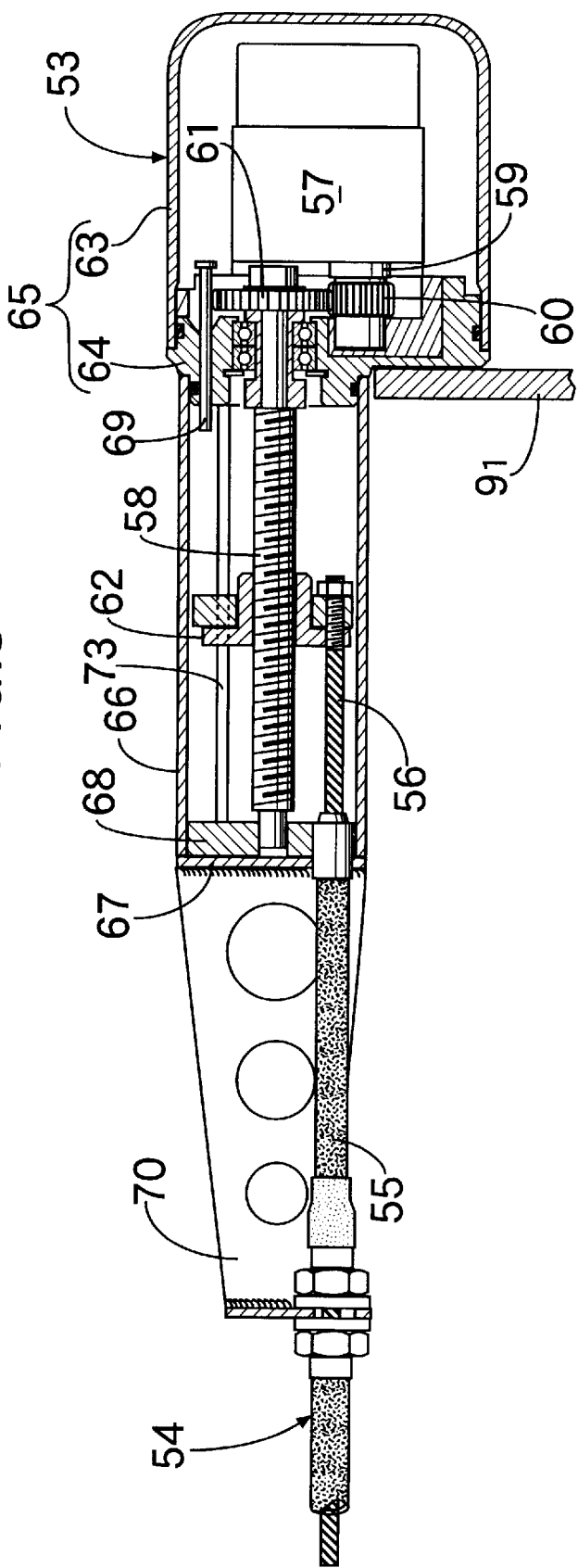

Referring to FIG. 8, the cable driving means 53 includes a cable driving motor 57, a threaded shaft 58 extending in a direction parallel to an rotational axis of the cable driving motor 57, a driving gear 60 provided on an output shaft 59 of the cable driving motor 57, a driven gear 61 meshed with the driving gear 60 and fixed to one end of the threaded shaft 58, and a nut 62 threadedly engaged with the threaded shaft 58, so that the rotation thereof about an axis of the threaded shaft 58 is inhibited.

The cable driving motor 57 is fixed to an end plate 64 within a case 65 which includes a cap-shaped cover 63 and the end plate 64 fastened to the first support plate $9_1$ to close an opened end of the cover 63, and the threaded shaft 58 is rotatably supported at one end thereof by the end plate 64 to protrude into the case 65. The output shaft 59 protruding from the cable driving motor 57 is rotatably supported at its tip end by the end plate 64, and the driving gear 60 provided integrally on the output shaft 59 within the case 65 is meshed with the driving gear 28 fixed to one end of the threaded shaft 58 within the case 65.

A guide case 66 is secured at one end thereof to the end plate 64 of the case 65. The guide case 66 has the threaded shaft 58 accommodated therein and extends from the first support plate $9_1$ toward the second support plate $9_2$, with the other end of the guide case 66 being closed by a closing plate 67. The threaded shaft 58 is rotatably supported at the other end thereof by a shaft receiving plate 68 which abuts against an inner surface of the closing plate 67. A pair of limiting rods 73 are mounted between the shaft receiving plate 68 and the end plate 64 at locations offset from the axis of the threaded shaft 58, and extend in parallel to the axis of the threaded shaft 58. Thus, the rotation of the shaft receiving plate 68 within the guide case 66 is inhibited. Moreover, the limiting rods 73 extend through the nut 62 threadedly engaged with the threaded shaft 58, so that the rotation of the nut 62 is inhibited by the limiting rods 73. Therefore, the nut 62 is reciprocally moved in an axial direction in response to the rotation of the threaded shaft 58. A stopper 69 is fixed to the end plate 64 and abuts against the nut 62 to define an end of movement of the nut 62 in a direction toward the end plate 64.

The push-pull cable 54 includes an inner cable portion 56 movably inserted through an outer cable portion 55. The outer cable portions 55 in both of the push-pull cables 54, 54 are fixed at one ends thereof to a tip end of a first stay 70 connected to the guide case 66 in such a manner that they extend from the guide case 66 toward the second support plate $9_2$, and the inner cable portion 56 protruding the one end of each of the outer cable portions 55 is movably passed through the closing plate 67 and the shaft receiving plate 68 and connected at one end thereof to the nut 62.

On the other hand, a second stay 71 is secured to each of the turning frames 11 between two (which are closer to the second support plate $9_2$) of the five sun-ray collecting units 12 on each of the turning frames 11. A vertically extending arm 72 is disposed sideways of one of the sun-ray collecting units 12 which is closest to the second support plate $9_2$, in such a manner that its upper end is connected to the subsidiary shaft 48 and its lower end is connected to the connecting shaft 51.

The other ends of the outer cable portions 55, 55 in the push-pull cables 54, 54 are fixed to the second stays 71, 71, respectively, and the other ends of the inner cable portions 56, 56 protruding from the other ends of the outer cable portions 55, 55 are connected to the arms 72 in positions above a central position between the subsidiary shaft 48 and the connecting shaft 51, respectively. In other words, the other ends of the inner cable portions 56, 56 are connected in positions closer to the subsidiary shaft 48 above vertically central portions of the sun-ray collecting units 12.

The plurality of, e.g., five sun-ray collecting units 12 disposed on each of the pair of turning frames 11, 11 are connected together in series through lead wires 76 which are disposed along each of the first turning axes C1, C1.

Each of the lead wires 76 are passed through the support member 15 at a bottom of each of the sun-ray collecting units 12 and connected to the base plate 16, as shown in FIG. 3. The lead wires 76 connected to the sun-ray collecting units 12 disposed at ends adjacent the first support plate $9_1$ in the direction of arrangement of the sun-ray collecting units 12, are drawn into the gear case 21 mounted on the first support plate $9_1$, so that they are passed air-tightly through through-bores 77 coaxially provided in the first main shaft $19_1$, as shown in FIG. 5. Then, each of such lead wires 75 is connected to each of external lead wires 79 extending outside the gear case 21 through each of connectors 7 secured to the support plate 29.

On the other hand, the lead wires 76 connected to the sun-ray collecting unit 12 disposed at ends adjacent the second support plate $9_2$ in the direction of arrangement of the sun-ray collecting units 12, are passed air-tightly through through-bores 80 coaxially provided in the second main shaft $19_2$, as shown in FIG. 6, and connected to each other outside the second support plate $9_2$.

The operation of the embodiment will be described below. The sun-ray collecting units 12 disposed in lines on the first turning axes C1, C1 on the pair of turning frames 11, 11 turnable about the pair of first turning axes C1, C1 parallel to each other, are supported for turning movement about the second turning axes C2, respectively. Therefore, the sun-ray collecting units 12 are turned about their portions located on the first turning axes C1, C1, when they are turned about the first turning axes C1, C1 of the turning frames 11, 11. Thus, a space required by the turning movement of the sun-ray collecting units 12 about the first turning axis C1 can be reduced to a relative small size, and a large number of sun-ray collecting units 12 can be turned on a large scale. When the first turning axis C1 is disposed in the north-south direction, the sun-ray collecting units 12 can be turned on the large scale, as the sun moves from the east to the west.

The turning-frame driving means 20, 20 disposed in the fixed positions corresponding to the turning frames 11, 11, respectively, and the driving force is input from the turning-frame driving motor 40 to one of the turning-frame driving means 20, 20 and transmitted from the driving shaft 24 included in the one turning-frame driving means 20 to the driving shaft 24 included in the other turning-frame driving means 20. Therefore, the sun-ray collecting units 12 can be turned in operative association with one another about the first turning axes C1, C1 by the single turning-frame driving motor 40 without a complicated control.

Moreover, the driving shaft 24 of the turning-frame driving means 20 to which the turning-frame driving motor 40 is connected and the driving shaft 24 of the other turning-frame driving means 20, are interconnected through the transmitting shaft 44 and the universal joints 45 and 46. Therefore, a variation in size between the turning-frame driving means 20, 20 due to an error in assembling of the turning-frame driving means 20, 20 to the first support plate $9_1$ or the like can be absorbed to ensure the reliable transmission of the power.

In addition, since the transmitting shaft 44 is disposed in the position below the first support plate 9, a space for disposition of the transmitting shaft 44 is required no more than enough. Thus, the space efficiency can be enhanced, and the transmitting shaft 44 and the universal joint 45 can be protected by the first support plate $9_1$ and hence, it is unnecessary to largely increase the strength of the protecting case 47 having the transmitting shaft 44 and the universal joint 45 accommodated therein.

Further, even if the reduction ratio in each of the turning-frame driving means 20, 20 is increased by the worm 25 and the worm wheel 26 included in each of the turning-frame driving means 20, 20, so that the amount of operation of the turning-frame driving motor 40 is larger, the amount of turning movement of each of the turning frames 11, 11 about each of the first turning axes C1, C1 can be reduced, whereby the turning movement of the sun-ray collecting units 12 about each of the first turning axes C1, C1 can be controlled with a good accuracy. Additionally, a reverse preventing function can be provided in each of the turning-frame driving means 20, 20 by the meshing engagement of the worm 25 and the worm wheel 26 and hence, each of the turning frames 11, 11 can be prevented from being turned by an external effect. Moreover, the position of the rotary shaft 30 in which the worm wheel 26 is mounted can be regulated in the axial direction of the driving shaft 24. Therefore, the backlash between the gears included in the turning-frame driving means 20, 20 can be easily absorbed to prevent the generation of a noise during operation and to prevent the generation of a dispersion in amount of turning movement of the turning frames 11, 11 to the utmost.

The sun-ray collecting units 12 are supported for turning movement about the second turning axes C2 and connected together by the parallel link 52 disposed in the plane parallel to the first turning axis C1, and each of the pair of push-pull cables 54, 54 connected at their one ends to the single cable driving means 53 are connected at the other end to one of the plurality of sun-ray collecting units 12 supported on each of the turning frames 11, 11. Therefore, the sun-ray collecting units 12 can be turned in operative association with one another about the second turning axes C2 in a simple structure using the single cable driving motor 57 without a complicated control.

Moreover, the cable driving means 53 is mounted on the first support plate $9_1$ between the pair of turning-frame driving means 20, 20 mounted on the first support plate $9_1$, and the pair of turning-frame driving means 20, 20 for driving the turning frames 11, 11 in turning movement about the first turning axes C1, C1 and the single cable driving means 53 for driving the sun-ray collecting units 12 in turning movement about the second turning axes C2 can be disposed in a compact arrangement on one $9_1$ of the first and second support plates $9_1$ and $9_2$ commonly supporting the turning frames 11, 11.

The sun-ray collecting units 12 are supported at their upper portions on the turning frames 11, 11 for turning movement about the second turning axes C2, and hence, they are supported on the turning frames 11, 11 in the positions closer to the upper surfaces, i.e., light-receiving surfaces of the sun-ray collecting units 12, whereby the positions of the light receiving surfaces can be stabilized. Especially, when the upper portion of each of the sun-ray collecting units 12 has a shape larger than that of the lower portion as in the embodiment, the position of the light receiving surface can be stabilized effectively, and the supporting balance of the sun-ray collecting unit 12 is improved.

In addition, since the push-pull cables 54, 54 are connected to the sun-ray collecting units 12 above the vertically central portions of the sun-ray collecting units 12, the sun-ray collecting units 12 can be turned on a relatively large scale about the second turning axes C2, using the push-pull cables 54, 54 each performing a relatively small stroke.

Further, the lead wires 76 connecting the sun-ray collecting units 12 in series to one another are disposed along the first turning axes C1, C1, and the lead wires extending from the sun-ray collecting units 12 located at the opposite ends in the direction of arrangement of the sun-ray collecting units 12 are drawn to the outside of the first and second support plates $9_1$ and $9_2$ through the first and second main shafts $19_1$ and $19_2$ whose positions are not changed even if the sun-ray collecting units 12 are turned about the first and second turning axes C1 and C2. Therefore, the surplus loosening of the lead wires can be reduced to the utmost and hence, a space for the loosened surplus of the lead wires can be reduced, and the appearance of the lead wires disposed can be improved.

Further, the lead wires 76 are connected to the bottoms of the sun-ray collecting units 12 and hence, it is easy to connect the sun-ray collecting units 12 in series to one another.

Although the embodiment of the present invention has been described in detail, it will be understood that the present invention is not limited to the above-described embodiment, and various modifications may be made without departing from the spirit and scope of the invention defined in claims.

For example, the single turning-frame driving motor 40 is mounted on only one of the turning-frame driving means 20, 20 in the embodiment, but each of the turning-frame driving means 20, 20 may include a turning-frame driving motor 40.

In addition, the sun-ray collecting unit 12 may be intended to collect and recover a solar heat, rather than collecting sun rays to generate an electric power.

What is claimed is:

1. A sun-ray tracking system comprising:

first and second parallel rows of sun-ray collecting units, each row arranged along a first turning axis and having a plurality of said collecting units, said first and second rows of collecting units rotatable about said first turning axes and said collecting units in each of said first and second rows being rotatable about respective second axes perpendicular to said first turning axes;

a turning frame supported between first and second stationary support plates for rotatable supporting each of said first and second rows of collecting units on said turning frame, each turning frame being turned about each of said first turning axes, wherein each of said first and second rows of collecting units are connected together by a parallel link disposed in a plane parallel to each of said first turning axes and are arranged on each of said first turning axes, each of said collecting units are arranged on each of said first turning axes;

a single cable driving means mounted on said first support plate; and a pair of push-pull cables, each cable having one end connected to said cable driving means and the other end connected to one of said collecting units on each of said first and second rows.

2. A sun-ray tracking system according to claim 1, wherein said turning frames are supported on said first and second stationary support plates through first and second main shafts coaxially disposed on said first turning axes;

said collecting units being connected together in series through lead wires disposed along said first turning axes; and portions of said lead wires extending from opposite end ones of said collecting units in a direction of arrangement of said collecting units are passed through said first and second shafts and drawn to positions outside of said first and second support plates.

3. A sun-ray tracking system according to claim 1 or 2, further including a pair of turning-frame driving means provided on said first support plate for driving said turning frames for turning movement about said first turning axes, respectively, said cable driving means being mounted on said first support plate between both said turning-frame driving means.

4. A sun-ray tracking system according to claim 2, wherein at least said first main shaft is secured to each of said turning frames, the system further comprising turning-frame driving means which are provided for each of said turning frames on said first support plate that supports both said first main shafts commonly and turnably, each of said turning-frame driving means being formed to have a driving shaft having a rotational axis perpendicular to an axis of said first main shaft and is connected to said first main shaft, and a drive source connected to said driving shaft in one of said turning-frame driving means, said driving shaft of said one turning-frame driving means and said driving shaft of said other turning-frame driving means being connected to each other through universal joint means.

5. A sun-ray tracking system according to claim 1 or 2, wherein said collecting units are supported at upper portions on each of said turning frames about said second turning axes.

6. A sun-ray tracking system according to claim 1, wherein the other ends of said push-pull cables are connected to said collecting units above vertical central portions thereof of said collecting units.

7. A sun-ray tracking system according to claim 2, wherein said lead wires are connected to bottoms of said collecting units.

\* \* \* \* \*